United States Patent [19]

Anderson et al.

[11] 4,016,586
[45] Apr. 5, 1977

[54] PHOTOVOLTAIC HETEROJUNCTION DEVICE EMPLOYING A WIDE BANDGAP MATERIAL AS AN ACTIVE LAYER

[75] Inventors: Richard L. Anderson, Syracuse; Jack K. Clifton, New City, both of N.Y.; James V. Masi, Huntington; Seymour Merrin, Fairfield, both of Conn.

[73] Assignee: Innotech Corporation, Norwalk, Conn.

[22] Filed: Jan. 6, 1976

[21] Appl. No.: 646,935

Related U.S. Application Data

[63] Continuation of Ser. No. 455,309, March 27, 1974.

[52] U.S. Cl. .................................. 357/2; 357/4; 357/16; 357/30
[51] Int. Cl.² .................................. H01L 45/100
[58] Field of Search .................. 357/4, 2, 16, 30

[56] References Cited

UNITED STATES PATENTS 3,801,879  4/1974  Merrin .......................... 317/234 R Primary Examiner—Martin H. Edlow
Attorney, Agent, or Firm—Pennie & Edmonds

[57] ABSTRACT

A semiconductive heterojunction device particularly useful as a photovoltaic device such as a solar cell comprises a heterojunction formed between a first layer of semiconductor material exhibiting one type of electronic conductivity (N or P) and a second layer of a compositionally different material exhibiting the other type of electronic conductivity (P or N), which second layer has an energy bandgap relatively wider than that of the semiconductor material and an electron affinity less than or equal to the electron affinity of the semiconductor. Preferably, the wider bandgap material is a glassy amorphous material which possess or is doped to possess a low resistivity below about $10^7$ ohm-cm. In devices employing N-type wider bandgap layers, the conduction band energy level of the wider bandgap material is preferably at substantially the same energy level as the conduction band energy level of the narrower bandgap material at electrical neutrality. In devices employing P-type wider bandgap layers, the valence band energy level of the wider bandgap material is preferably at substantially the same energy level as the valence band energy level of the narrower bandgap material.

12 Claims, 5 Drawing Figures

PHOTOVOLTAIC HETEROJUNCTION DEVICE EMPLOYING A WIDE BANDGAP MATERIAL AS AN ACTIVE LAYER

This is a continuation of application Ser. No. 455,309, filed Mar. 27, 1974 now abandoned.

BACKGROUND OF THE INVENTION

The present invention relates to a semiconductive heterojunction device which is particularly useful as a photovoltaic device such as a solar cell.

Conventional solar cells typically comprise a P-N junction formed in a monocrystalline silicon substrate. Typically, an N-type surface region is diffused into a P-type silicon substrate and ohmic contacts are applied. In operation, the device is exposed to solar radiation; and photons, incident upon the N-type surface, travel to the junction region and the P-type substrate where they are absorbed in the production of electron-hole pairs. Holes created in the junction region (or which diffuse to the junction region) are swept by the built-in voltage to the N-type surface region where they either leave the device as photocurrent or accumulate to produce a photo-induced open circuit voltage.

The conversion efficiency of conventional solar cells, however, is seriously limited by a number of factors. One such factor is that the built-in voltage is limited by the relatively narrow bandgap of the N-type silicon and the limited extent to which both layers of silicon can be doped. While the built-in voltage of the device can be increased by increased doping of both layers forming the junction, such excess doping tends to reduce conversion efficiency of the device by reducing its collection efficiency. As a consequence, the open circuit voltages of typical silicon solar cells are only about 50 percent of the silicon bandgap.

A second factor limiting the conversion efficiency of conventional silicon solar cells is the fact that silicon tends to absorb high energy photons (photons of blue and violet light) near the surface, typically within a micron thereof. As a consequence, many of the high energy photons are absorbed near the surface of the N-type region and the carriers generated by this absorption recombine at the surface. Such recombined carriers are thereby lost as sources of photocurrent.

Yet a third limiting factor is the fact the lower energy photons (photons of red and near infra-red light) tend to penetrate deeply into silicon before they are absorbed. While minority carriers created by deep absorption can contribute to the photo current if minority carrier lifetimes are sufficient to permit them to drift into the junction region, the high temperature diffusion step required to form the N-type region significantly reduces minority carrier lifetime in the P-type substrate. As a consequence, many carriers created by deep absorption are lost to the photocurrent.

SUMMARY OF THE INVENTION

It has been discovered by the present applicants that semiconductive heterojunction devices can be made into photovoltaic devices having improved conversion efficiencies by properly selecting the bandgaps and electron affinities of the constituent materials.

Specifically, an improved photovoltaic junction device, in accordance with the invention, comprises heterojunction formed between a first layer of semiconductor material exhibiting one type of electronic conductivity (N or P) and a second layer of a compositionally different material exhibiting the other type of electronic conductivity (P or N), which second layer has an energy bandgap relatively larger than that of the semiconductor material and an electron affinity less than or equal to the electron affinity of the semiconductor. Preferably the wider bandgap material is a glassy amorphous material which possess or is doped to possess a low resistivity below about $10^7$ ohm-cm.

In preferred embodiments, energy band levels of the materials are substantially aligned. Specifically, in devices employing N-type wider bandgap layers, the conduction band energy level of the wider bandgap material is preferably at substantially the same energy level as the conduction band energy level of the narrower bandgap material at electrical neutrality. In devices employing P-type wider bandgap layers, the valence band energy level of the wider bandgap material is preferably at substantially the same energy level as the valence band energy level of the narrower bandgap material.

Photovoltaic devices in accordance with the invention achieve improved energy conversion by virtue of a higher built-in voltage and increased collection efficiency.

BRIEF DESCRIPTION OF THE DRAWINGS

The advantages, nature, and various features of the present invention will appear more fully upon consideration of the illustrative embodiments now to be described in detail in connection with the accompanying drawings.

In the drawings.

DETAILED DESCRIPTION OF THE DRAWINGS

Figure 1:
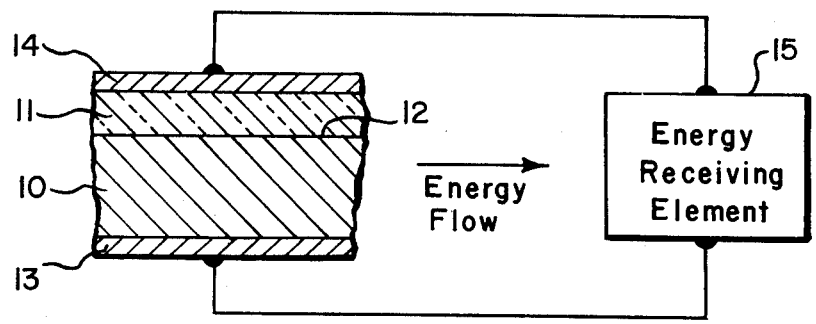
FIG. 1 is a cross-section of a semiconductive junction device in accordance with the invention especially useful as a photovoltaic device.

Referring to the drawing, FIG. 1 is a schematic cross-section of a photovoltaic semiconductive junction device comprising a first active layer 10 of a semiconductor material, such as crystalline silicon, exhibiting one type of electronic conductivity (N or P), and a second active layer 11 of a compositionally different, relatively wider bandgap material, exhibiting the other type of electronic conductivity (P or N, respectively). The wider bandgap layer 11 is disposed in contact with the narrower bandgap semiconductor layer 10, thereby forming a junction 12 therewith. Preferably, the wider bandgap material is a glassy amorphous material, such as indium trioxide, which has been doped to exhibit conductivity in the semiconducting range (i.e., it exhibits or is doped to exhibit a low resistivity below about $10^7$ ohm-cm).

Electrodes 13 and 14 are applied to layers 10 and 11, respectively, for making ohmic electrical contact therewith. Electrode 13, for example, can be aluminum for P-type silicon and tin for N-type silicon. Electrode 14 can also be alumnium for N-type wider bandgap layers, and tin for P-type. Preferably, the electrode contacting the layer to be directly exposed to incident radiation is a transparent conductive material such as tin oxide or a reduced area electrode having a grid or "finger" configuration in order to permit exposure of the layer surface. Typically, the wider bandgap layer 11 is the directly exposed layer, and electrode 14 is the transparent or reduced area electrode.

Electrodes 13 and 14 are, in turn, electrically coupled to an energy receiving element 15, such as a battery or detector (e.g., current detector or voltage detector), in a manner suitable for transmitting energy in the form of electrical current from the junction device to the receiving element 15.

The narrower bandgap semiconductor material of layer 10 can be a conventional monocrystalline semiconductor, such as silicon or gallium arsenide; a polycrystalline semiconductor such as a polycrystalline film of silicon or $Si_xGe_{1-x}$; or a semiconducting glassy amorphous material having a relatively narrow bandgap. Preferably, the narrower bandgap material is doped with N or P-type impurities to exhibit a level of resistivity on the order of 1 to 10 ohm-cm. Doping concentrations on the order of $10^{15}$ to $10^{19}$ impurity atoms per cubic centimeter are typically sufficient to achieve such resistivities.

The material of layer 11 should be chosen or adapted to meet a number of requirements. It should be compositionally different from the material of layer 10; it should exhibit a low level of resistivity; it should have a bandgap greater than about twice that of the narrower bandgap material; and it should have an electron affinity which is less than or equal to that of the narrower bandgap material. In preferred embodiments, the material is a glassy amorphous material which possesses or is doped to possess conductivity in the semiconducting range, i.e., it has a low resistivity below about $10^7$ ohm-cm.

The wider bandgap material of layer 11 should be compositionally different from the material of layer 10 so that a heterojunction is formed between the two layers. In the usual case, this requirement means that the material (excluding dopants) of which layer 11 is formed is a different chemical element or compound from the element or compound of which layer 10 is formed.

The wider bandgap material should be doped, if necessary, to exhibit a low resistivity below about $10^7$ ohm-cm. Resistivities so low as a few ohm-cm or lower can be used.

Figure 2A:
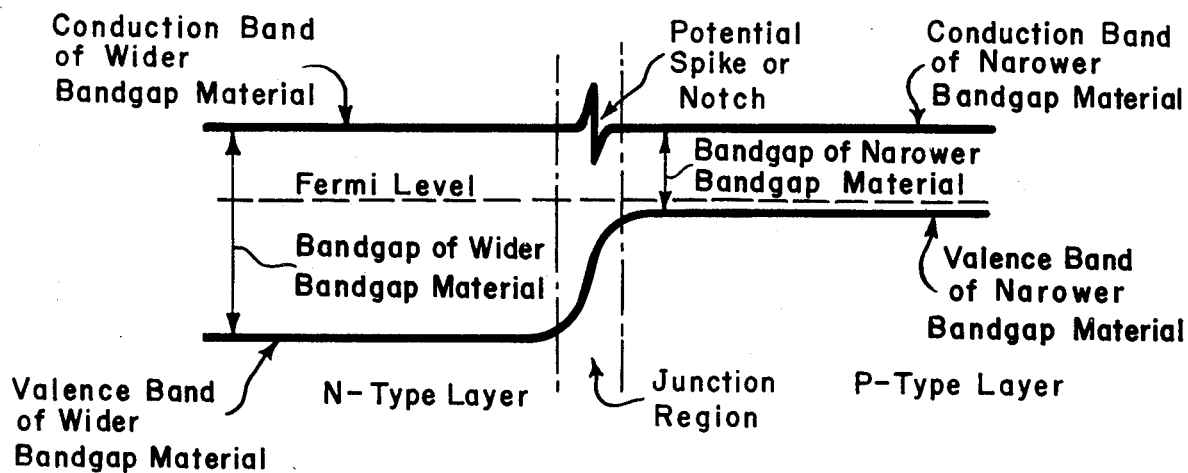
FIGS. 2A and 2B are energy level diagrams showing preferred energy relationships for the device of FIG 1.
Figure 2B:
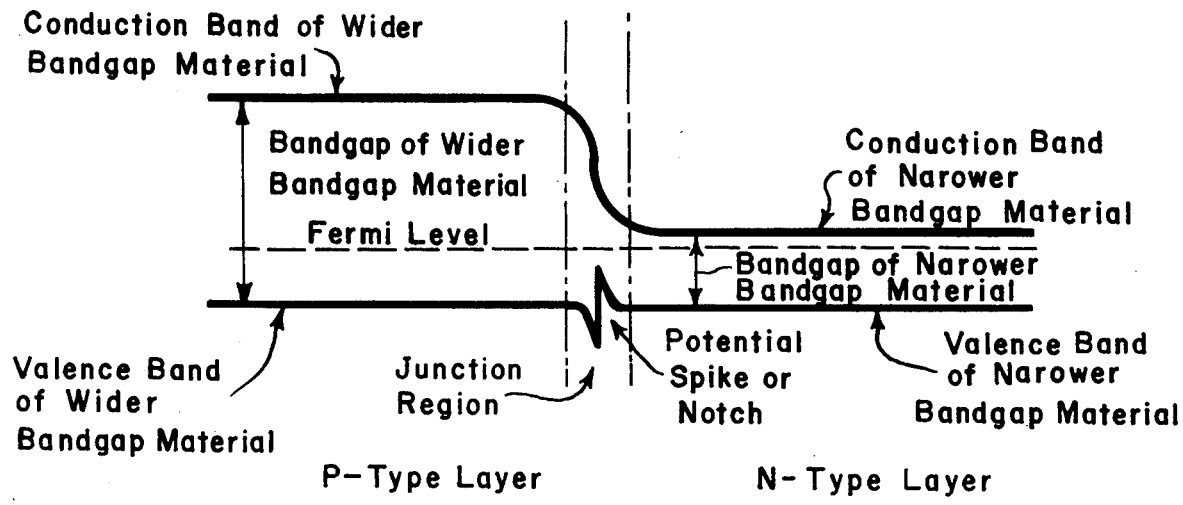

The bandgap and preferred energy band levels for the wider bandgap materials may be seen by reference to FIGS. 2A and 2B which are schematic energy band diagrams for junctions having an N-type wider bandgap layer and a P-type wider bandgap layer, respectively. As is shown in the Figures, the energy bandgaps of the wider bandgap layers and the narrower bandgap layers are the energy separations between the conduction band energy level and the valence band energy level for the respective materials.

In a device in accordance with the invention, the bandgap of the wider bandgap material is at least twice the bandgap of the narrower bandgap material. Thus, when the narrower bandgap material is silicon, the bandgap of the wider bandgap layer should be larger than 2.22 electron volts; and when the narrower bandgap material is gallium arsenide, it should be larger than about 2.80 electron volts. This larger bandgap permits utilization of a larger portion of the narrower bandgap in the built-in voltage, thereby increasing the voltage factor of the device.

Preferred materials for use as wider bandgap layers in devices according to the invention are glassy amorphous materials, and particularly transparent glassy amorphous materials. The term "glassy amorphous material" (or "glassy material"), as used herein, defines those materials which exhibit only short-term ordering. The term is intended to include not only glasses, but also those "amorphous" materials which have any appreciable short-range ordering. However, it is intended to exclude both crystalline substances (such as silicon and silicon dioxide) and true amorphous materials having no appreciable ordering. Glasses, which comprise a specific class of glassy amorphous materials, are typically quenched liquids having a viscosity in excess of about $10^{18}$ poise at ambient temperature. They are generally characterized by: (1) the existence of a single phase; (2) gradual softening and subsequent melting with increasing temperature rather than sharp melting characteristics; (3) conchoidal fracture; and (4) the absence of crystalline X-ray diffraction peaks. The principal advantages of glassy amorphous materials for use in solar cells are their relatively wide bandgaps and the fact that many glasses are transparent to wide bands of solar radiation.

The term "transparent glassy amorphous material" as used herein refers to those glassy materials which are substantially transparent to visible light. More specifically, a glassy layer in order to be considered transparent for purposes of making a solar cell, in accordance with the invention, should transmit more than about 80 percent of incident light having wavelengths in the region between about 4000 angstroms and about 7000 angstroms.

In heterojunction devices in accordance with the invention, the disparity in bandgap widths of the constituent layers results in potential spikes or notches in the junction as shown in FIGS. 2A and 2B. These potential spikes or notches can be undesirable barriers to carrier flow. Accordingly, when the device is to be used as a photovoltaic device, the electron affinities of the larger bandgap material and the narrower bandgap material are preferably chosen to minimize the notch impedance while retaining a high open circuit voltage. This result can be effected in a device having an N-type wider bandgap material by choosing as the wider bandgap material, a material having an electron affinity approximately equal to that of the narrow bandgap material or less than that of the narrow bandgap material by an amount not greater than the narrower bandgap. This requirement places the conduction bands of the two layers at substantially the same energy level and thereby reduces the notch to a very thin dimension through which carriers can readily tunnel. While the electron affinity of the wider bandgap material can be slightly higher than that of the narrower bandgap material, the open circuit voltage is reduced proportionately by the excess. Correspondingly, in a device having a P-type larger bandgap material, the wider bandgap material is chosen to have an electron affinity which is smaller than that of the narrower bandgap material by an amount in excess of the narrower bandgap. This requirement places the valence band of the larger bandgap material at substantially the same energy level as that of the narrower bandgap material and minimizes notch impedance consistent with maintaining a high open circuit voltage.

The bandgaps and electron affinities of component materials are well-defined and generally tabulated quantities. Bandgaps are generally tabulated as such, and electron affinities can be obtained by subtracting tabulated barrier heights from tabulated work functions. (For tabulations of typical materials, see American Institute of Physics Handbook, 3rd Ed., 1972 (McGraw-Hill).)

In instances where work functions of the wider bandgap and narrower bandgap materials are known or where the difference between the two work functions are known (as determined, for example, by measurement of the built-in voltage), a more precise selection of the preferred electron affinities is possible. In such cases wherein the wider bandgap material is an N-type material, the electron affinity of the wider bandgap material is ideally substantially equal to the electron affinity of the narrower bandgap material less the absolute value of the difference between the work functions of the two materials. If the wider bandgap material is a P-type material, its electron affinity is ideally substantially equal to the electron affinity of the narrower bandgap material increased by the absolute value of the difference between the work functions.

Materials which have been found particularly advantageous for use as wider bandgap materials in conjunction with conventional semiconductor (such as silicon, germanium, gallium arsenide, gallium phosphide, and silicon carbide), include indium trioxide ($InO_3$), tin oxide ($SnO_2$), cadmium oxide (CdO), antimony trioxide ($Sb_2O_3$), lead oxide (Pbo), vanadium oxide ($V_2O_5$), germanium oxide ($GeO_2$), vanogermanate glasses, vanophosphate glasses, lead silicate glasses, and glassy mixtures of the above.

Materials preferred for use with substrates of P-type silicon, P-type germanium, P-type gallium arsenide, and P-type gallium phosphide include indium trioxide, tin oxide, cadmium oxide, antimony trioxide, and mixtures thereof.

For N-type silicon substrates, a glass of the kind having the following oxide components, doped with indium trioxide, is preferred.

TABLE 1

| Oxide Component | Preferred Mole Percent | Permissible Range |
| --- | --- | --- |
| PbO | 0.2 | 0.2% – 2.6% |
| $B_2O_3$ | 34.6 | 34.6% – 37.6% |
| $Al_2O_3$ | 0.8 | 0.8% – 0.9% |
| ZnO | 52.5 | 52.5% – 52.6% |
| $CeO_2$ | 2.2 | 0% – 2.2% |
| $SiO_2$ | 9.7 | 6.3% – 9.7% |

TABLE 1

Preferred materials for use with P-type gallium arsenide substrates include lead oxide, germanium oxide, vanadium oxide, vanogermanate glass, vanophosphate glass, and mixtures thereof.

For N-type gallium arsendie substrates, a glassy amorphous material having the composition set forth in Table 1 and doped with indium trioxide is preferred.

The thickness of the layer of wider bandgap material is preferably not more than about several microns and not less than about a few hundred angstroms. In general, the layer should be as thin as is possible consistent with maintaining a sufficient thickness to avoid significant tunneling of carriers therethrough. By making the layer sufficiently thin, even materials which are not normally considered transparent can be formed into layers which transmit sufficient quantities of light to be useful.

The device of FIG. 1 can be fabricated by any one of several techniques. Conveniently, a thin layer of glassy amorphous material is deposited on a semiconductor substrate by a conventional technique such as vacuum evaporation. The glassy layer is then doped to a low resistivity in the semiconducting range. The doping can be effected either by conventional diffusion doping or by the doping techniques disclosed in copending application Ser. No. 227,932 filed by Seymour Merrin on Feb. 22, 1972, and assigned to applicant's assignee. The electrodes are then deposited, e.g., by vacuum evaporation or sputtering, and the resulting structures are packaged. The electrodes are then connected to an energy receiving element, such as a battery in charging polarity.

In operation as a solar cell, the device of FIG. 1 is exposed to solar radiation and electrical energy flows from the device to the energy receiving element. While applicants do not wish to be bound by theory, it is believed that the wider bandgap material acts as a window through which incident solar radiation passes to the semiconductor substrate. Photons of the radiation are absorbed in the substrate by the creation of electron-hole pairs. In devices having N-type substrates, holes which are created in the transition region (or which diffuse thereto) are swept by the built-in voltage to layer 11 where they either contribute to the photocurrent or accumulate to develop an open circuit equilibrium voltage. In devices having P-type substrates, electrons are swept into the layer 11 with the same result.

The structure and fabrication of such devices may be further understood by reference to the following specific examples:

EXAMPLE 1

A photovoltaic device was fabricated by depositing through vacuum evaporation a 1000 angstrom layer of indium trioxide on a one square centimeter slice of silicon having a P-type conductivity with a specific resistivity of approximately 10 ohm-cm. due to the presence of boron dopant. The indium trioxide layer was then doped by depositing a dopant of metallic indium on the surface of the layer by vacuum evaporation and heating the resulting structure to approximately 400° C. for about 10 minutes. As a result of this treatment, the specific resistivity of the indium trioxide was lowered from an initial value of about $10^7$ ohm-cm. to about 100 ohm-cm.

Electrodes were then applied to the indium trioxide layer and the silicon substrate. The upper electrode was formed by applying a one micron layer of tin to the indium trioxide layer through a finger configuration mask. The resulting finger-shaped electrode covered less than about 6 percent of the exposed surface of the indium trioxide layer. The lower electrode was formed by applying approximately 5000 angstroms of gold to the exposed surface of the silicon substrates using vacuum evaporation.

Figure 3:
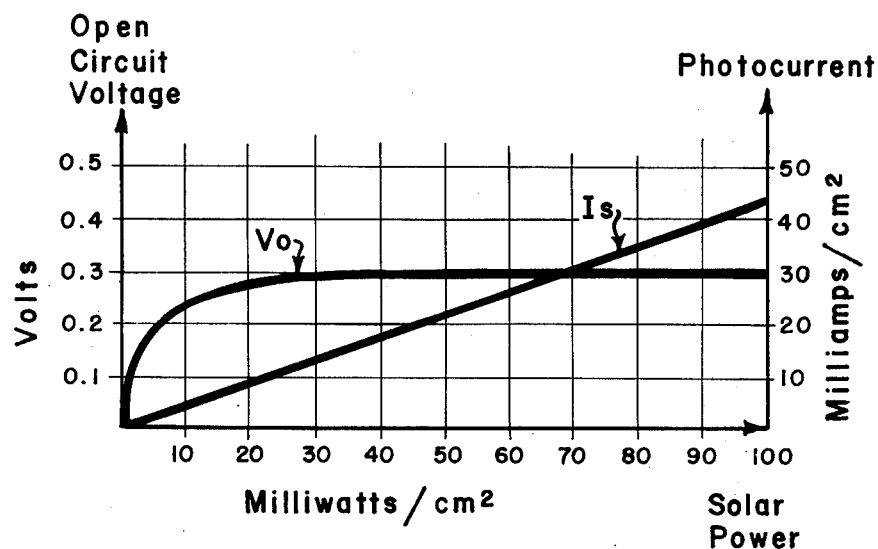
FIG. 3 is a graphical illustration showing the relationship among current, voltage and incident radiation for a typical device in accordance with the invention.
Figure 4:
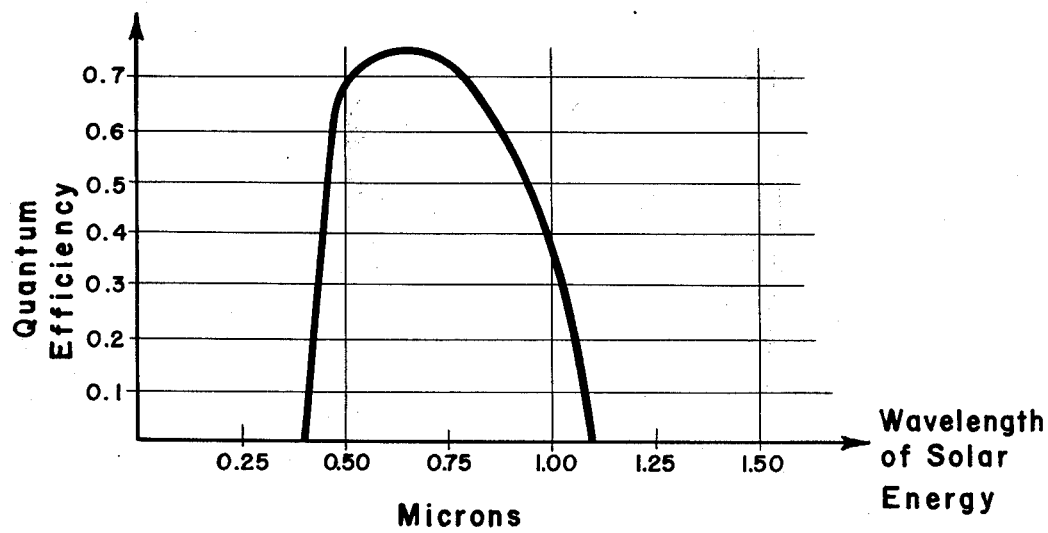
FIG. 4 is a graphical illustration showing the quantum efficiency of a typical device in accordance with the invention as a function of wavelength.

When exposed to solar radiation, the device acted as a solar cell. The open circuit voltage between electrodes was measured as 0.3 volts and the short circuit current was measured as 25 milliamps for incident radiation of approximately 90 milliwatts per square centimeter. FIG. 3 graphically illustrates the relationship among the short circuit photocurrent, open-circuit voltage and intensity of incident radiation. FIG. 4, which is a graphical plot of its quantum efficiency for different wavelengths, illustrates its spectral response to radiation in pertinent regions of the spectrum. This solar cell exhibited no appreciable impedance attributable to energy band notching.

EXAMPLE 2

A photovoltaic device was fabricated by depositing on a one square centimeter square of gallium phosphide, a P-type glass having the following composition:

TABLE 2

| Oxide Component | Mole Per Cent |
|---|---|
| PbO | 49.5 |
| $SiO_2$ | 49.5 |
| $P_2O_3$ | 1.0 |

TABLE 2

The gallium phosphide substrate contained N-type zinc impurities at concentration of about $2 \times 10^{17}$ atoms per cubic centimeter. The above-composition glass was deposited by the well-known sedimentation technique to form a layer about 5000A thick. The glass was then doped by applying to it a layer of boron oxide estimated to be less than about 100 angstroms thick and heating the structure to 350° C for 10 minutes. A chrome electrode about 500 angstroms thick was deposited on the glass and a 1000 angstrom gold electrode applied to the gallium phosphide.

The resulting structure acted as a photovoltaic device and exhibited no appreciable impedance attributable to energy band notching

EXAMPLE 3

A photovoltaic device was fabricated in substantially the same manner as set forth in Example 2, except that N-type gallium arsenide was substituted for the N-type gallium phosphide. The resulting device acted as a photovoltaic device and exhibited no appreciable impedance attributable to energy band notching.

EXAMPLE 4

A photovoltaic device was fabricated by depositing a 5000 angstrom layer of the preferred glass composition set forth in Table 1 on a one centimeter square of N-type silicon carbide doped with nitrogen to a concentration of $2 \times 10^{18}$. A chrome electrode was applied to the glass and a gold electrode was applied to the silicon carbide. The resulting structur acted as a photovoltaic device and exhibited no appreciable impedance attributable to energy band notching.

The characteristics of devices in accordance with the invention are relatively superior over those of conventional silicon solar cells. While applicants do not wish to be bound by theory, it is believed that these favorable characteristics result from improved collection efficiency and a higher built-in voltage. Collection efficiency is improved for at least two reasons. First, the wider bandgap material is substantially transparent to high energy photons, thereby reducing losses due to surface recombinations. Second, due to the fact that the wider bandgap material can generally be doped at lower temperatures than those used in fabricating conventional diffused junctions, the device can be made with an enhanced minority carrier lifetime in the semiconductor substrate. This enhanced lifetime enables more minority carriers produced by the deep penetration of low energy photons to diffuse to the junction and thereby contribute to the photocurrent.

The higher built-in voltage results from the disparity of bandgaps of the two layers resulting in a more nearly complete utilization of the semiconductor bandgap in the built-up voltage.

In addition, the device offers considerable promise of increased yields and lower fabrication costs due to the relatively simple process steps required for its fabrication.

It is understood that the above-described embodiments are illustrative of only a few of the many possible specific embodiments which can represent applications of the principles of the invention. Numerous and varied other arrangements can be readily devised in accordance wth these principles by those skilled in the art without departing from the spirit and scope of the invention.

We claim:
1. A semiconductive heterojunction photovoltaic device of the type comprising a pair of layers of semiconductor materials disposed in contact with one another and forming a junction therebetween, one of said layers exhibiting N-type conductivity and the other exhibiting P-type conductivity, and the material of each of said layers characterized by a bandgap separating a conduction energy level band from a valence energy level band and by an electron affinity; and means for electrically contacting each of said layers; said device characterized in that:
   the bandgap of the material of one of said semiconductor layers is more than about twice the bandgap of the material of the other of said semiconductor layers; and
   the electron affinity of the material having the larger bandgap is substantially equal to or less than the electron affinity of the layer having the smaller bandgap material for providing reduced junction impedance to carrier flow.
2. A device according to claim 1 further characterized in that the electron affinity of the larger bandgap material is less than the electron affinity of the smaller bandgap material by at least the amount of the smaller bandgap.
3. A device accoring to claim 1 further characterized in that the conduction energy bands of the materials of said two layers are at substantially the same energy level for providing reduced junction impedance to carrier flow.
4. A device according to claim 1 further characterized in that:
   the layer of material having the larger bandgap exhibits N-type electronic conductivity:
   the layer of material having the smaller bandgap exhibits P-type electronic conductivity; and
   the conduction energy bands of the materials of said two layers are at substantially the same energy level.
5. A device according to claim 1 further characterized in that the valence energy bands of the materials of said two layers are at substantially the same energy levels.
6. A device according to claim 1 further characterized in that:

the layer of material having the larger bandgap exhibits P-type electronic conductivity;
the smaller bandgap material exhibits N-type electronic conductivity; and
the valence energy bands of the material of said two layers are at substantially the same energy level.

7. A device according to claim 1 further characterized in that the material of at least one of said layers is glassy amorphous material.

8. A device according to claim 1 further characterized in that the material of at least one of said layers is a material selected from the group consisting of indium trioxide, tin oxide, cadmium oxide, antimony trioxide, lead oxide, vanadium oxide, germanium oxide, vanogermanate glasses, vanophosphate glasses, lead silicate glasses and glassy mixtures of the above.

9. A device according to claim 1 further characterized in that the material of the layer having the narrower bandgap is P-type silicon and in that the material of the layer having the larger bandgap is selected from the group consisting of indium trioxide, tin oxide, cadmium oxide, antimony trioxide and glassy mixtures thereof.

10. A device according to claim 1 further characterized in that the material of the layer having the narrower bandgap is an N-type semiconductor and in that the material of the layer having the larger bandgap is a glass of the type which is formed by the following oxide components in the following mole percentage ranges:

| Component | Mole Per Cent |
|---|---|
| PbO | 0.2 – 2.6 |
| $B_2O_3$ | 34.6 – 37.6 |
| $Al_2O_3$ | 0.8 – 0.9 |
| $Z_nO$ | 52.5 – 52.6 |
| $CeO_2$ | 0 – 2.2 |
| $SiO_2$ | 6.3 – 9.7 |

11. A device according to claim 1 further characterized in that:
the layer of material having the larger bandgap exhibits N-type electronic conductivity;
the layer of material having the smaller bandgap exhibits P-type conductivity; and
the electron affinity of the wider bandgap material is less than that of the narrow bandgap material by an amount not greater than the narrower bandgap.

12. A device according to claim 11 further characterized in that the conduction energy bands of the materials of said two layers are at substantially the same energy levels for providing reduced junction impedance to carrier flow.

* * * * *